(12) United States Patent
Sha et al.

(10) Patent No.: US 10,579,764 B2
(45) Date of Patent: *Mar. 3, 2020

(54) CO-MODELING POST-LITHOGRAPHY CRITICAL DIMENSIONS AND POST-ETCH CRITICAL DIMENSIONS WITH MULTI-TASK NEURAL NETWORKS

(71) Applicant: INTERNATIONAL BUSINESS MACHINES CORPORATION, Armonk, NY (US)

(72) Inventors: Jing Sha, White Plains, NY (US); Ekmini A. De Silva, Slingerlands, NY (US); Derren N. Dunn, Sandy Hook, CT (US)

(73) Assignee: International Business Machines Corporation, Armonk, NY (US)

( * ) Notice: Subject to any disclaimer, the term of this patent is extended or adjusted under 35 U.S.C. 154(b) by 9 days.

This patent is subject to a terminal disclaimer.

(21) Appl. No.: 16/001,435

(22) Filed: Jun. 6, 2018

(65) Prior Publication Data
US 2019/0377847 A1   Dec. 12, 2019

(51) Int. Cl.
*G06F 17/50*  (2006.01)
*G06K 9/62*  (2006.01)
*G06N 3/08*  (2006.01)

(52) U.S. Cl.
CPC ....... *G06F 17/5068* (2013.01); *G06K 9/6256* (2013.01); *G06N 3/08* (2013.01)

(58) Field of Classification Search
CPC ..... G06F 17/5068; G06N 3/08; G06K 9/6256
See application file for complete search history.

(56) References Cited

U.S. PATENT DOCUMENTS

| | | | | |
|---|---|---|---|---|
| 6,054,710 A | * | 4/2000 | Bruggeman | G03F 7/70491 250/252.1 |
| 6,641,746 B2 | * | 11/2003 | Houge | H01J 37/32935 156/345.24 |
| 7,636,904 B2 | | 12/2009 | Song et al. | |
| 8,732,629 B2 | | 5/2014 | Tong | |
| 9,176,183 B2 | | 11/2015 | Zhu et al. | |
| 9,910,348 B2 | * | 3/2018 | Han | G03F 1/36 |
| 9,965,901 B2 | * | 5/2018 | Zhang | G06F 17/5081 |

(Continued)

OTHER PUBLICATIONS

Bristol et al., "Lithographic stochastics: beyond 3a", Journal of Micro Nanolithography, MEMS and MOEMS. vol. 16(2). Apr.-Jun. 2017. pp. 1-6.

(Continued)

*Primary Examiner* — Naum Levin
(74) *Attorney, Agent, or Firm* — Tutunjian & Bitetto, P.C.; Vazken Alexanian

(57) ABSTRACT

A method is presented for constructing a deep neural network based model to concurrently simulate post-lithography critical dimensions (CDs) and post-etch critical dimensions (CDs) and to improve the modeling accuracy of each process respectively. The method includes generating lithographic aerial images of physical design layout patterns, constructing a multi-task neural network including two output channels, training the multi-task neural network with the training data of the lithographic aerial images, and outputting simulated critical dimension values pertaining to lithography and etch processes.

20 Claims, 9 Drawing Sheets

(56) References Cited

U.S. PATENT DOCUMENTS

| | | | |
|---|---|---|---|
| 10,209,615 B2* | 2/2019 | Li | G03F 1/36 |
| 10,210,606 B2* | 2/2019 | Pandev | G06T 7/001 |
| 2003/0002878 A1* | 1/2003 | Singh | G03F 7/70633 |
| | | | 396/611 |
| 2005/0199341 A1* | 9/2005 | Delp | H01J 37/32 |
| | | | 156/345.24 |
| 2010/0216064 A1 | 8/2010 | Takimoto et al. | |
| 2017/0004233 A1* | 1/2017 | Han | G03F 1/36 |
| 2017/0148226 A1* | 5/2017 | Zhang | G06F 17/5081 |
| 2017/0255737 A1 | 9/2017 | Van Leest et al. | |
| 2018/0314148 A1* | 11/2018 | Tetiker | G03F 1/70 |
| 2018/0322234 A1* | 11/2018 | Cao | G06F 17/5036 |
| 2019/0087526 A1* | 3/2019 | Park | G06F 17/5081 |
| 2019/0129297 A1* | 5/2019 | Shim | G03F 1/36 |

OTHER PUBLICATIONS

Brunner et al., "Line-Edge Roughness performance targets for EUV Lithography", Extreme Ultraviolet (EUV) Lithography VII. vol. 101430. International Society for Optics and Photonics. Mar. 24, 2017. pp. 1-10.

Civay et al., "Deconstructing contact hole CD printing variability in EUV lithography", Extreme Ultraviolet (EUV) Lithography V. vol. 9048. International Society for Optics and Photonics. Apr. 17, 2014. pp. 1-17.

Kim et al., "Lithography Focus/Exposure Control and Corrections to Improve CDU at Post Etch Step", Metrology, Inspection, and Process Control for Microlithography XXVIII. vol. 9050. International Society for Optics and Photonics. Apr. 2014. pp. 1-9.

Shim et al., "Etch Proximity Correction through Machine-Learning-Driven Etch Bias Model", Advanced Etch Technology for Nanopatterning V. vol. 9782. International Society for Optics and Photonics. Mar. 23, 2016. pp. 1-10.

Watanabe et al., "Accurate Lithography Simulation Model based on Convolutional Neural Networks", Optical Macrolithography XXX. vol. 10147. International Society for Optics and Photonics. Mar. 30, 2017. pp. 1-9.

Xu et al., "Demystifying Multitask Deep Neuroal Networks for Quantitative Structure-Activity Relationships", Journal of Chemical Information and Modeling. vol. 57(10). Oct. 2, 2017. pp. 2490-2504.

* cited by examiner

US 10,579,764 B2

CO-MODELING POST-LITHOGRAPHY CRITICAL DIMENSIONS AND POST-ETCH CRITICAL DIMENSIONS WITH MULTI-TASK NEURAL NETWORKS

BACKGROUND

Technical Field

The present invention relates generally to process modeling in semiconductor manufacturing and more specifically, to co-modeling post-lithography critical dimensions and post-etch critical dimensions by employing multi-task neural networks.

Description of the Related Art

In a conventional integrated circuit design process, a circuit designer begins with a conceptual idea of what functions an integrated circuit is to perform. The circuit designer then creates a circuit design on a computer and verifies the circuit design by employing simulation tools to ensure that the circuit operates as desired. The design at this stage can be represented by a circuit schematic, but can also be represented by higher level abstractions within the computer. These abstract designs are then converted to physical definitions of the circuit elements to be fabricated. These definitions, often referred to as drawn designs of the circuit layout, represent the geometric boundaries for the physical devices to be fabricated.

SUMMARY

In accordance with an embodiment, a method is provided for concurrently modeling post-lithography critical dimensions (CDs) and post-etch critical dimensions (CDs). The method includes generating lithographic aerial images of selected physical design layout patterns, the lithographic aerial images employed as training data, constructing a first portion of a neural network to be shared by two output channels, constructing a second portion of the neural network to be customized for each of the two output channels, training the neural network with the training data, and outputting simulated critical dimension values for lithography and etch processes.

In accordance with another embodiment, a method is provided for constructing a multi-task neural network based model to concurrently simulate post-lithography critical dimensions (CDs) and post-etch critical dimensions (CDs). The method includes generating lithographic aerial images of physical design layout patterns, constructing a multi-task neural network including two output channels, training the multi-task neural network with the training data of the lithographic aerial images, and outputting simulated critical dimension values pertaining to litho and etch processes.

In accordance with another embodiment, a system is provided for constructing a multi-task neural network based model to concurrently simulate post-lithography critical dimensions (CDs) and post-etch critical dimensions (CDs). The system includes one or more computer subsystems and one or more components executed by the one or more computer subsystems, wherein the one or more components comprise the machine learning based model configured for performing one or more simulations by: generating lithographic aerial images of selected physical design layout patterns, the lithographic aerial images employed as training data, constructing a first portion of a neural network to be shared by two output channels, constructing a second portion of the neural network to be customized for each of the two output channels, training the neural network with the training data, and outputting simulated critical dimension values for lithography and etch processes.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The invention will provide details in the following description of preferred embodiments with reference to the following figures wherein.

Throughout the drawings, same or similar reference numerals represent the same or similar elements.

DETAILED DESCRIPTION

Embodiments in accordance with the present invention provide methods and devices for concurrently performing post-litho or post-lithography critical dimension (CD) and post-etch critical dimension (CD) modeling or simulations by employing multi-task neural networks.

Embodiments in accordance with the present invention provide methods and devices for concurrently or simultaneously modeling both photolithography steps and etching steps for full-chip level evaluation by employing multi-task neural networks. The exemplary embodiments of the present invention employ microscopic parameters, such as lithographic aerial image parameters during lithography to concurrently or simultaneously model post-lithography CD and post-etch CD. The post-lithography CD and post-etch CD are simulated by employing neural networks, such as multi-task neural networks in order to improve simulation accuracy. Also, hyperparameters of the neural network are fine-tuned to improve modeling accuracy (e.g., matching simulated CDs to measured CDs (or wafer CDs by metrology on real patterned wafers)).

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

Figure 1:
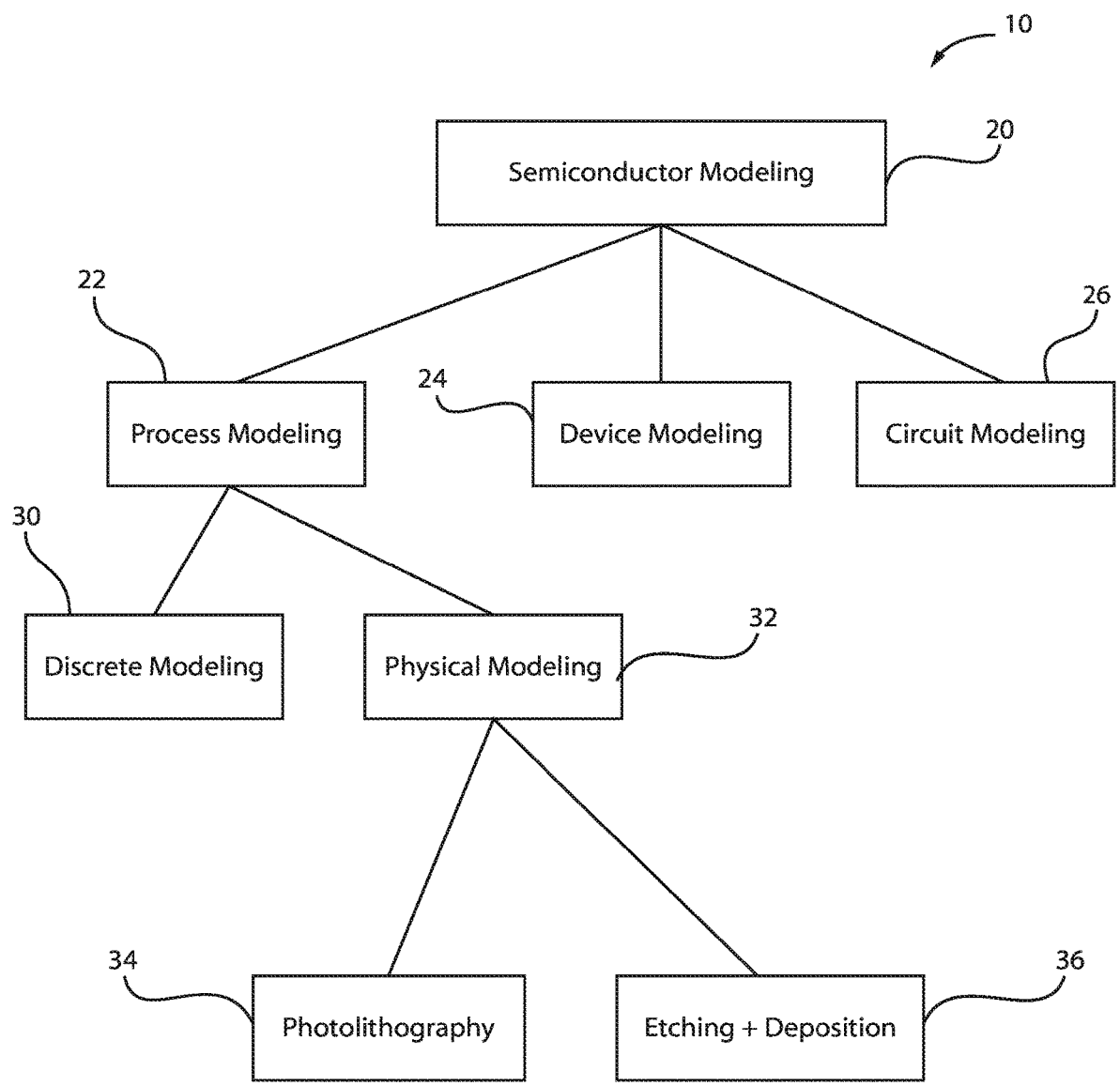
FIG. 1 is a block/flow diagram illustrating semiconductor modeling, in accordance with an embodiment of the present invention.

FIG. 1 is a block/flow diagram illustrating semiconductor modeling, in accordance with an embodiment of the present invention.

The block/flow diagram 10 separates semiconductor modeling 20 into three categories. The first category involves process modeling 22, the second category involves device modeling 24, and the third category involves circuit modeling 26. The process modeling 22 can be categorized into discrete modeling 30 and physical modeling 32. The physical modeling 32 can include at least photolithography modeling 34, and etching and deposition modeling 36. The exemplary embodiments of the present invention involve physical modeling 32, and in particular, concurrently executing photolithography modeling 34 and etch modeling 36 by employing multi-task neural networks.

Figure 2:
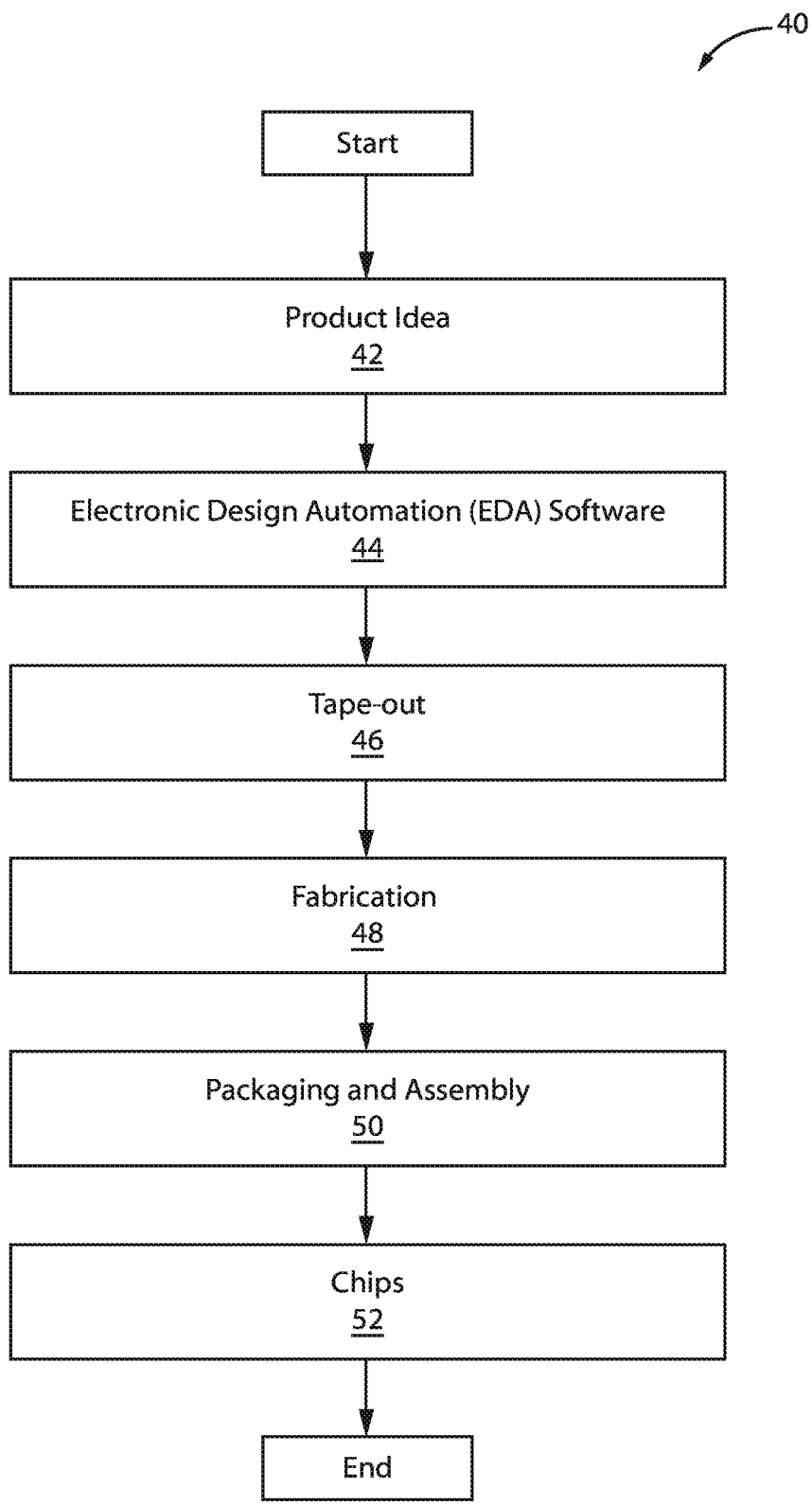
FIG. 2 is an exemplary block/flow diagram illustrating an electronic design automation (EDA) software design process, in accordance with an embodiment of the present invention.

FIG. 2 is a block/flow diagram illustrating a simplified representation of an exemplary digital integrated circuit (IC) flow, in accordance with an embodiment of the present invention.

At a high level, the process 40 starts with the product idea 42 and is realized in an electronic design automation (EDA) software design process 44. When the design is finalized, it can be taped-out 46. After tape out, the fabrication process 48 and packaging and assembly processes 50 occur resulting, ultimately, in finished chips 52.

Figure 3:
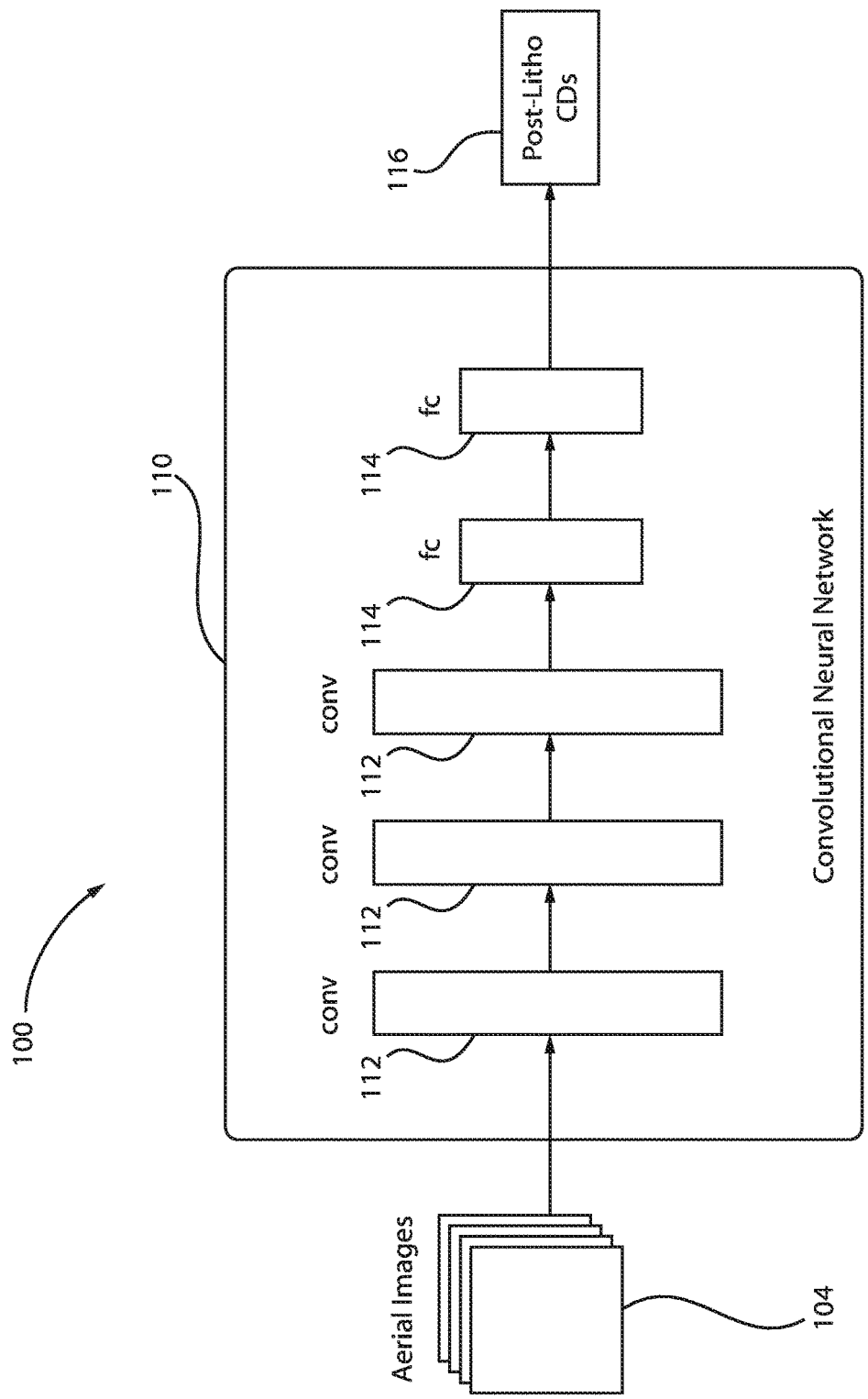
FIG. 3 is an exemplary block/flow diagram illustrating a post-litho critical dimension (CD) modeled with neural networks.

FIG. 3 is a conventional block/flow diagram illustrating a post-litho critical dimension (CD) modeled with neural networks.

Photolithography tools and systems usually include a source of radiation at a desired wavelength, an optical system and a mask or reticle that includes a pattern that is desired to be formed on a wafer. Radiation is provided through or reflected off the mask or reticle to form an image on a light-sensitive layer of a photoresist material that is formed on the surface of a semiconductor wafer. With that said, photolithography is an important step in the semiconductor manufacturing process. As a result, creating simulation models for photolithography can be valuable when designing new integrated circuits (ICs). System 100 depicts a lithographic simulation model based on neural networks.

Aerial images 104 can be input into a convolutional neural network (CNN) 110 including a plurality of convolutional layers 112 and a plurality of fully connected layers 114. The CNN 110 can output post-litho critical dimensions (CDs) 116.

Figure 4:
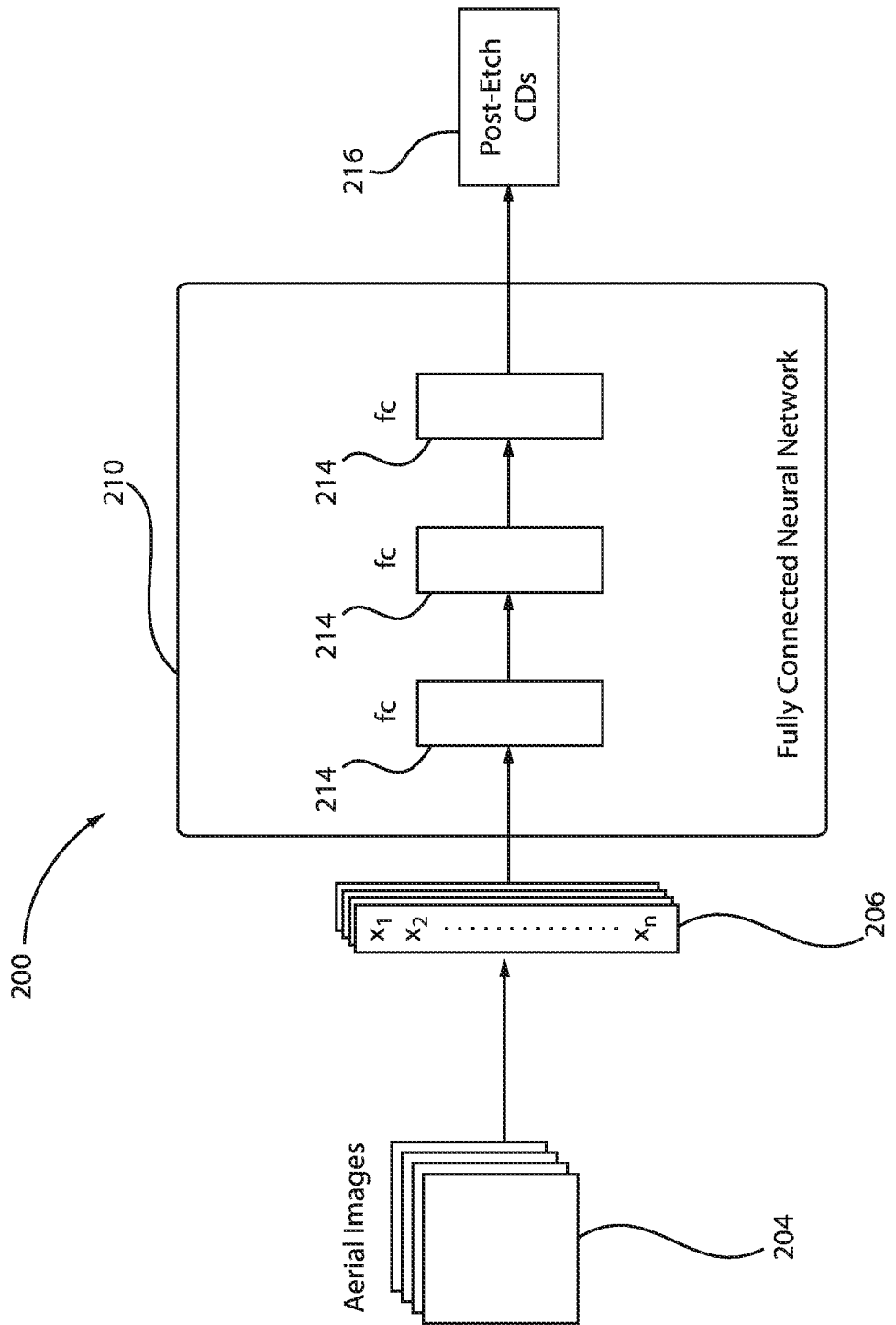
FIG. 4 is an exemplary block/flow diagram illustrating a post-etch critical dimension (CD) modeled with neural networks.

FIG. 4 is a conventional block/flow diagram illustrating a post-etch critical dimension (CD) modeled with neural networks.

The various processes used to form a micro-chip that will be packaged into an IC fall into four general categories, namely, film deposition, removal/etching, semiconductor doping, and patterning/lithography. With that said, etching is an important step in the semiconductor manufacturing process. As a result, creating simulation models for etching can be valuable when designing new integrated circuits (ICs). System 200 depicts an etch simulation model based on Fully Connected Neural Networks. The Fully Connected Neural Network architecture includes inputting aerial images 204 and feature parameters 206 into the Fully Connected Neural Network 210 including a plurality of fully connected layers 214. The feature parameters 206 can impact etch bias. The feature parameters are extracted from aerial images (or layout patterns) based on a number of criteria. The Fully Connected Neural Network 210 can output etch biases (differences between DCDs and FCDs) and thus post-etch critical dimensions (CDs) 216. It is noted that even though such conventional system shown in FIG. 4 extracts features/parameters from layout patterns to be fed into the Fully Connected Neural Network 210, this step of feature engineering can be replaced with a convolutional neural network (CNN), which is the shared first part of the multi-task neural network (NN) of FIG. 5 below.

Figure 5:
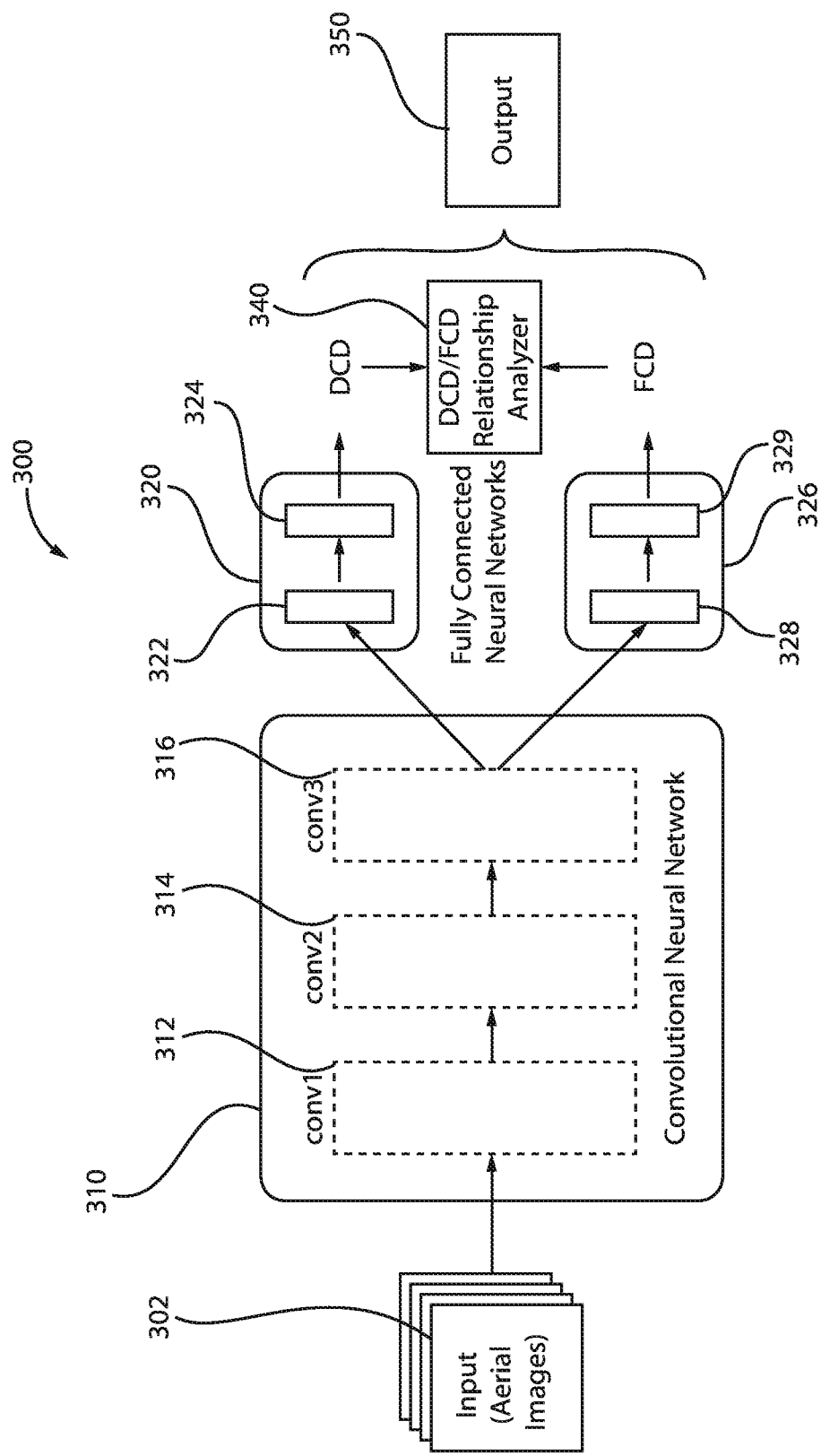
FIG. 5 is a block/flow diagram illustrating a pipeline for concurrently modeling post-litho CD and post-etch CD with multi-task neural networks, in accordance with an embodiment of the present invention.

FIG. 5 is a block/flow diagram illustrating a pipeline for concurrently modeling post-litho CD and post-etch CD with multi-task neural networks, in accordance with an embodiment of the present invention.

In producing a very-large-scale integration (VLSI) integrated circuit (IC), usually the circuits of the IC are designed for functionality and then put through a layout process. The layout process produces a drawn layout of the IC. The IC of question can, for instance, be a whole computer processor, or can be only a portion of such. It may be a whole, or part, of a communication IC, or any other kind of IC, or part of an IC. Usually such a drawn layout is in digital form, which can be stored by digital media (e.g., storage devices). The term "drawn layout" can be used interchangeably with the term "layout."

The layout includes the various layers that will make up the IC during fabrication. The number of such layers for state of the art complicated ICs can run between 50 to 100, but with technology progress layers can run into the hundreds. Each layer in the layout is essentially a collection of shapes. Such shapes can be rectangles, or more generally polygons, or circles, or practically any geometric form, or even irregular forms. The boundary, or perimeter, or edge, of a shape is the contour of the shape.

When the IC is manufactured, the various layers of the drawn layout go through processing. Such processing is characterized by parameters. The layers to be processed can be, for instance, a polysilicon layer, a first wiring layer, a contact via layer, or any other known in the art. Parameters characterizing the processing can be, for instance, focal point during a lithographic illumination, duration of illumination, thickness of a masking layer, or any other known in the art.

Given a drawn layout, the processing for any chosen parameter set can be simulated. Such simulations can be carried out digitally in computer processors. Any particular parameter set is characterizing one processing point. The simulation with the chosen parameter set results in a modified drawn layout, one which includes how the shape contours on the various layers shifted during the processing. Such a simulation can be referred to as a patterning simulation.

In view thereof, multi-task neural networks can be employed to implement a model 300 for modeling or simulating post-litho etch and post-etch CD concurrently or simultaneously. The multi-task neural network can take the form of other neural network architectures other than CNNs and Fully Connected Neural Networks. The convolution neural network (CNN) 310 can receive lithographic aerial images 302 generated from, e.g., litho patterns. The lithographic aerial images 302 are directly used to generate feature parameters in contrast to the conventional system of FIG. 4 where feature extraction is needed to generate the feature parameters. The generation of feature parameters is bypassed in FIG. 5 by employing the CNN or other NN architecture in the first half of the multi-task neural network.

The CNN 310 can include a plurality of convolutional layers 312, 314, 316 and a plurality of pooling layers (not shown) in between the convolutional layers 312, 314, 316. The output of the CNN 310 can be received by a first fully connected neural network 320 (first output channel) and a second fully connected neural network 326 (second output channel). The fully connected neural network 320 includes fully connected layers 322, 324 and the second fully connected neural network 326 includes fully connected layers 328, 329. Hyperparameters of the neural network are fine-tuned based on the simulated critical dimension values for lithography and etch processes.

It is also noted that the pattern of the etch mask has a critical dimension (CD) from lithographic exposure and development. The CD of the etch mask can be referred to as developed CD (DCD). The pattern of the etched wafer has a patterned or final CD (FCD). An etch bias (Ebias) can be defined as the difference between DCD and FCD, as illustrated by the following equation: Ebias=DCD−FCD. The DCD and the FCD can be DCD and FCD averages that are input into a DCD/FCD relationship analyzer 340 that analyzes the relationship between the DCD and the FCD. All this information can be output to an output unit 350. Therefore, the DCD and FCD are modeled as asymmetric distributions (multiple parameters) rather than as symmetric distributions (single parameter). It is noted that DCD or FCD distributions for each layout pattern or aerial image can be described by several numbers (e.g., DCD/FCD average, standard deviation, skewness, etc.), which are also correlated, as the DCDs are correlated to the FCDs of the same aerial images. Consequently, multi-task neural networks can be employed to model parameters describing DCD and FCD distributions concurrently or simultaneously for more robust litho and etch simulation models. The DCD averages or distributions are analyzed on how they transform into corresponding FCD averages or distributions.

Figure 6:
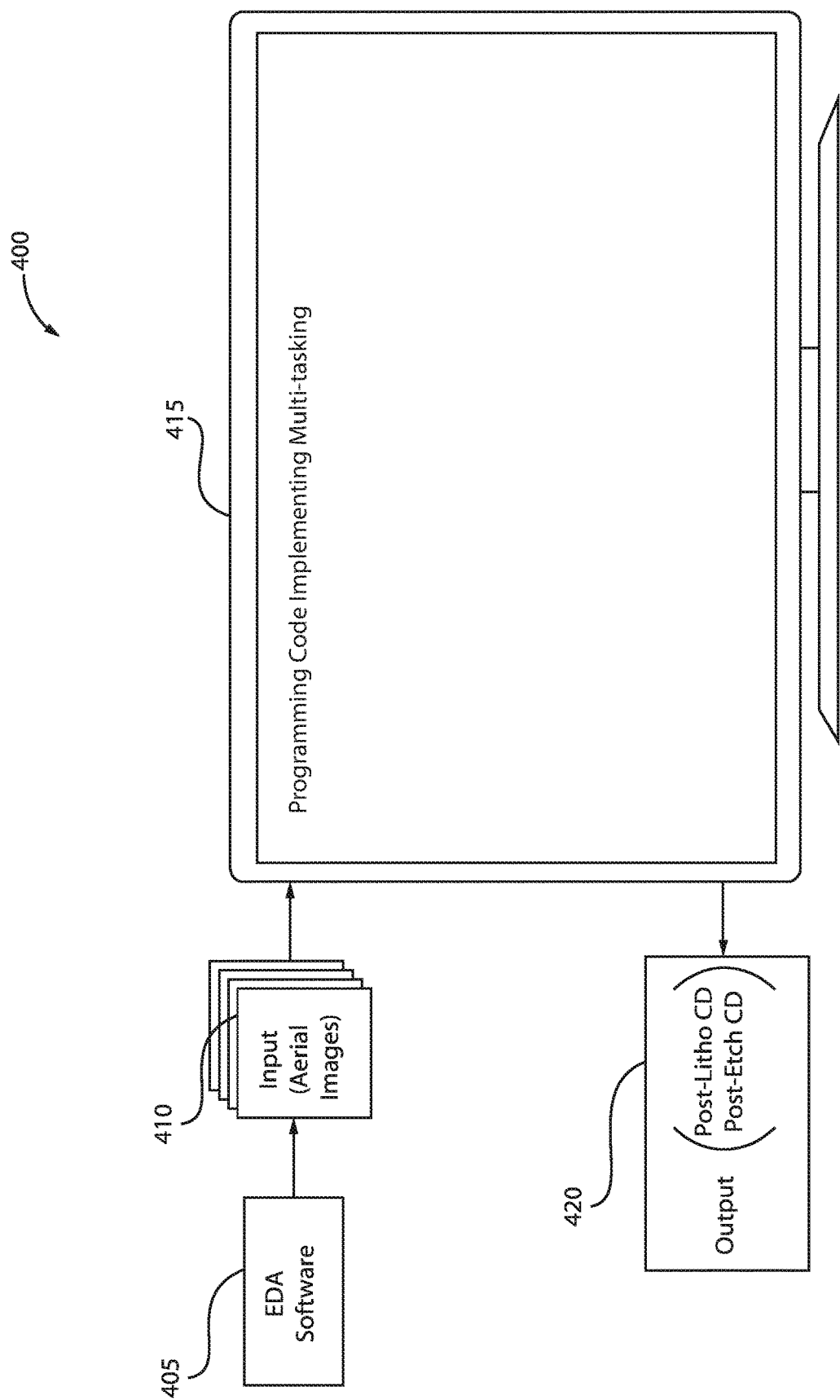
FIG. 6 is a block/flow diagram illustrating a visual representation of a model architecture output displayed on a user interface, in accordance with an embodiment of the present invention.

FIG. 6 is a block/flow diagram illustrating a visual representation of a model architecture output displayed on a user interface, in accordance with an embodiment of the present invention.

The model architecture output 400 is displayed on a user interface 415, such as a display monitor. The user interface 415 shows the inputs (aerial images) 410 received, as well as the outputs 420 generated by employing a model for concurrently modeling post-litho CD and post-etch CD processes. The output 420 can be generated by employing programming code implementing multi-tasking. In one example, the aerial images 410 can be provided by EDA software 405. Visual representations of the simulated critical dimension values for lithography and etch processes can be displayed on one or more user interfaces for analysis.

The advantages of the present invention are that single-step modeling of both post-litho CD and post-etch CD can be performed (efficiency), multi-task models can make better predictions than single-task models when targets are correlated (accuracy), the multi-task neural network models can be tuned on a case-by-case basis (flexibility), and that the trained model can be applied to a full chip layout (scalability). Since post-litho CD and post-etch CD are correlated, simultaneous or concurrent modeling can result in better accuracy in both models because of employment of multi-task neural networks.

Figure 7:
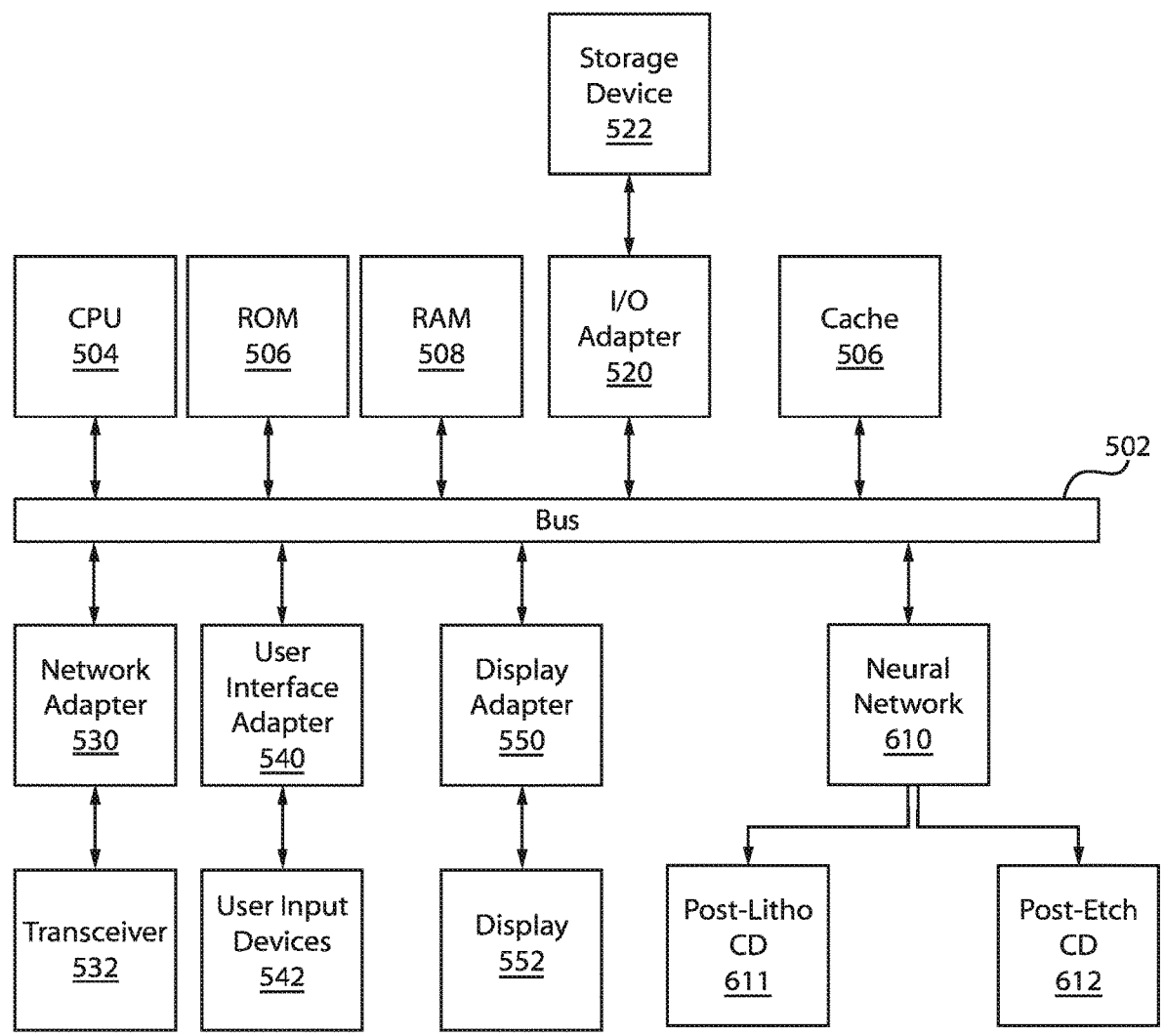
FIG. 7 is an exemplary processing system for concurrently modeling post-litho CD and post-etch CD with multi-task neural networks, in accordance with embodiments of the present invention.

FIG. 7 is an exemplary processing system for concurrently modeling post-litho CD and post-etch CD with multi-task neural networks, in accordance with embodiments of the present invention.

The processing system includes at least one processor (CPU) 504 operatively coupled to other components via a system bus 502. A cache 506, a Read Only Memory (ROM) 508, a Random Access Memory (RAM) 510, an input/output (I/O) adapter 520, a network adapter 530, a user interface adapter 540, and a display adapter 550, are operatively coupled to the system bus 502. Additionally, the neural network 610 can communicate with the system bus 502 to conduct concurrent or simultaneous modeling of post-litho CD 611 and post-etch CD 612.

A storage device 522 is operatively coupled to system bus 502 by the I/O adapter 520. The storage device 522 can be any of a disk storage device (e.g., a magnetic or optical disk storage device), a solid state magnetic device, and so forth.

A transceiver 532 is operatively coupled to system bus 502 by network adapter 530.

User input devices 542 are operatively coupled to system bus 502 by user interface adapter 540. The user input devices 542 can be any of a keyboard, a mouse, a keypad, an image capture device, a motion sensing device, a microphone, a device incorporating the functionality of at least two of the preceding devices, and so forth. Of course, other types of input devices can also be used, while maintaining the spirit of the present invention. The user input devices 542 can be the same type of user input device or different types of user input devices. The user input devices 542 are used to input and output information to and from the processing system.

A display device 552 is operatively coupled to system bus 502 by display adapter 550.

Of course, the processing system can also include other elements (not shown), as readily contemplated by one of skill in the art, as well as omit certain elements. For example, various other input devices and/or output devices can be included in the system, depending upon the particular implementation of the same, as readily understood by one of ordinary skill in the art. For example, various types of wireless and/or wired input and/or output devices can be used. Moreover, additional processors, controllers, memories, and so forth, in various configurations can also be utilized as readily appreciated by one of ordinary skill in the art. These and other variations of the processing system are readily contemplated by one of ordinary skill in the art given the teachings of the present invention provided herein.

Figure 8:
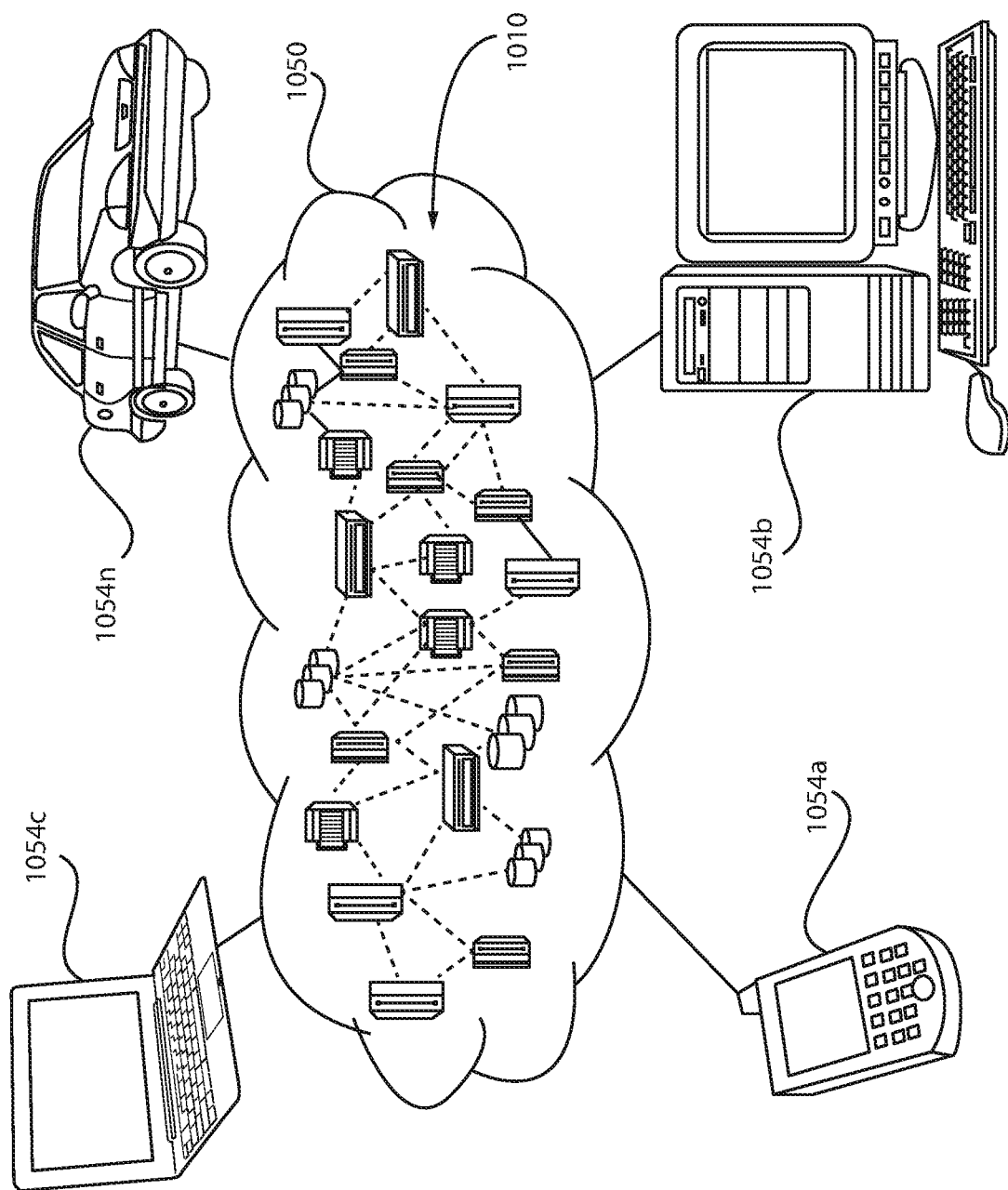
FIG. 8 is a block/flow diagram of an exemplary cloud computing environment, in accordance with an embodiment of the present invention.

FIG. 8 is a block/flow diagram of an exemplary cloud computing environment, in accordance with an embodiment of the present invention.

It is to be understood that although this invention includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model can include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but can be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported, providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It can be managed by the organization or a third party and can exist on-premises or off-premises.

Community cloud: the cloud infrastructure is shared by several organizations and supports a specific community that has shared concerns (e.g., mission, security requirements, policy, and compliance considerations). It can be managed by the organizations or a third party and can exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure that includes a network of interconnected nodes.

Referring now to FIG. 8, illustrative cloud computing environment 1050 is depicted for enabling use cases of the present invention. As shown, cloud computing environment 1050 includes one or more cloud computing nodes 1010 with which local computing devices used by cloud consumers, such as, for example, personal digital assistant (PDA) or cellular telephone 1054A, desktop computer 1054B, laptop computer 1054C, and/or automobile computer system 1054N can communicate. Nodes 1010 can communicate with one another. They can be grouped (not shown) physically or virtually, in one or more networks, such as Private, Community, Public, or Hybrid clouds as described hereinabove, or a combination thereof. This allows cloud computing environment 1050 to offer infrastructure, platforms and/or software as services for which a cloud consumer does not need to maintain resources on a local computing device. It is understood that the types of computing devices 1054A-N shown in FIG. 8 are intended to be illustrative only and that computing nodes 1010 and cloud computing environment 1050 can communicate with any type of computerized device over any type of network and/or network addressable connection (e.g., using a web browser).

Figure 9:
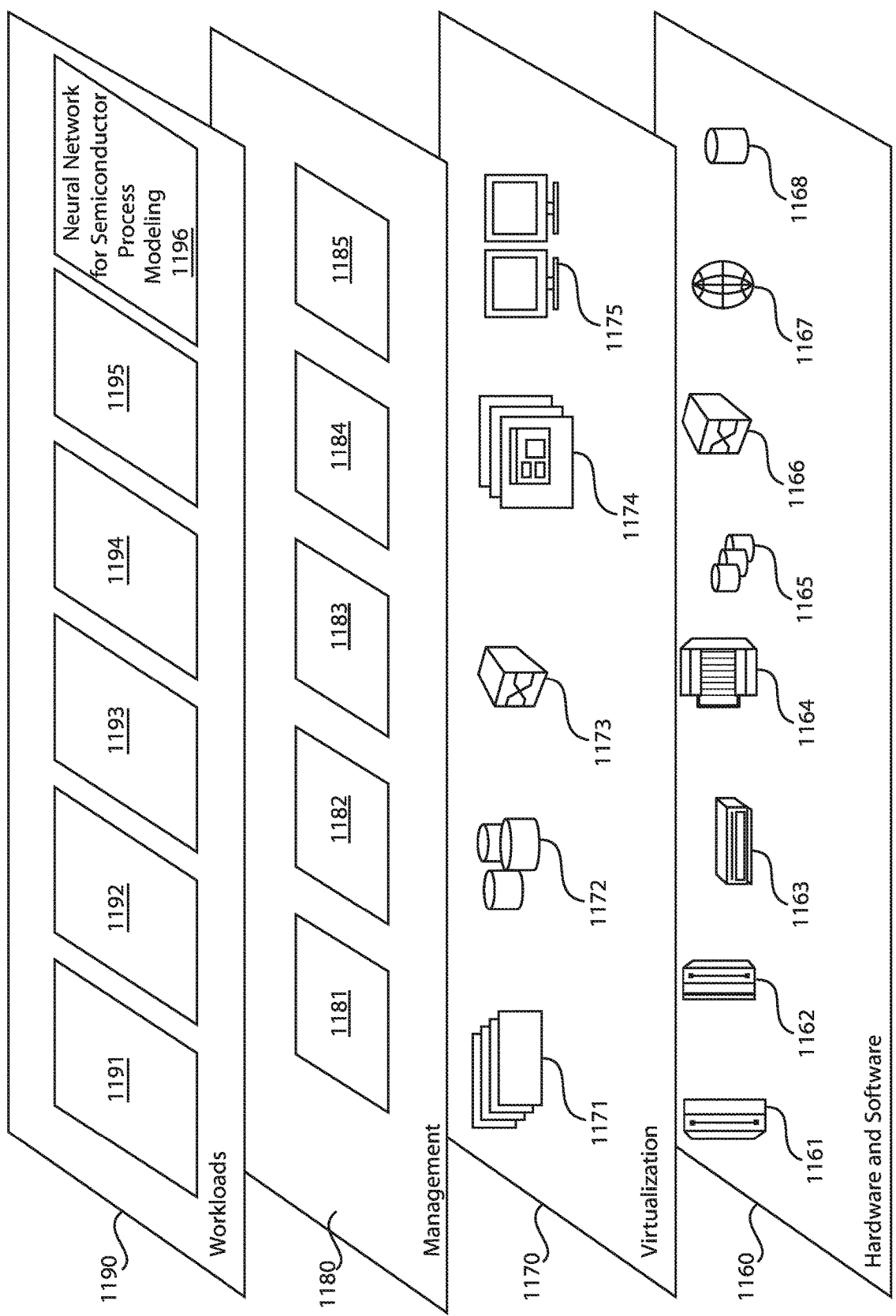
FIG. 9 is a schematic diagram of exemplary abstraction model layers, in accordance with an embodiment of the present invention.

FIG. 9 is a schematic diagram of exemplary abstraction model layers, in accordance with an embodiment of the present invention. It should be understood in advance that the components, layers, and functions shown in FIG. 9 are intended to be illustrative only and embodiments of the invention are not limited thereto. As depicted, the following layers and corresponding functions are provided:

Hardware and software layer 1160 includes hardware and software components. Examples of hardware components include: mainframes 1161; RISC (Reduced Instruction Set Computer) architecture based servers 1162; servers 1163; blade servers 1164; storage devices 1165; and networks and networking components 1166. In some embodiments, software components include network application server software 1167 and database software 1168.

Virtualization layer 1170 provides an abstraction layer from which the following examples of virtual entities can be provided: virtual servers 1171; virtual storage 1172; virtual networks 1173, including virtual private networks; virtual applications and operating systems 1174; and virtual clients 1175.

In one example, management layer 1180 can provide the functions described below. Resource provisioning 1181 provides dynamic procurement of computing resources and other resources that are utilized to perform tasks within the cloud computing environment. Metering and Pricing 1182 provide cost tracking as resources are utilized within the cloud computing environment, and billing or invoicing for consumption of these resources. In one example, these resources can include application software licenses. Security provides identity verification for cloud consumers and tasks, as well as protection for data and other resources. User portal 1183 provides access to the cloud computing environment for consumers and system administrators. Service level management 1184 provides cloud computing resource allocation and management such that required service levels are met. Service Level Agreement (SLA) planning and fulfillment 1185 provide pre-arrangement for, and procurement of, cloud computing resources for which a future requirement is anticipated in accordance with an SLA.

Workloads layer 1190 provides examples of functionality for which the cloud computing environment can be utilized. Examples of workloads and functions which can be provided from this layer include: mapping and navigation 1191; software development and lifecycle management 1192; virtual classroom education delivery 1193; data analytics processing 1194; transaction processing 1195; and neural network 1196 for concurrent or simultaneous modeling of post-litho CD 611 and post-etch CD 612.

Still yet, any of the components of the present invention could be created, integrated, hosted, maintained, deployed, managed, serviced, etc. by a service supplier who offers to provide a method for performing concurrent post-litho CD and post-etch CD simulations or modeling. Thus, the present invention describes a process for deploying, creating, integrating, hosting, maintaining, and/or integrating computing infrastructure, including integrating computer-readable code into the distributed network, wherein the code is capable of performing a method for concurrent post-litho CD and post-etch CD simulations or modeling. In another embodiment, the invention provides a business method that performs the process blocks/steps of the invention on a subscription, advertising, and/or fee basis. That is, a service supplier, such as a Solution Integrator, could offer to provide a method for concurrent post-litho CD and post-etch CD simulations or modeling. In this case, the service supplier can create, maintain, support, etc. a computer infrastructure that performs the process blocks/steps of the invention for one or more customers. In return, the service supplier can receive payment from the customer(s) under a subscription and/or fee agreement and/or the service supplier can receive payment from the sale of advertising content to one or more third parties.

Throughout this specification, plural instances can implement components, operations, or structures described as a single instance. Although individual operations of one or more methods are illustrated and described as separate operations, one or more of the individual operations can be performed concurrently, and nothing requires that the operations be performed in the order illustrated. Structures and functionality presented as separate components in example configurations can be implemented as a combined structure or component. Similarly, structures and functionality presented as a single component can be implemented as separate components. These and other variations, modifications, additions, and improvements fall within the scope of the subject matter herein.

The various operations of example methods described herein, such as those performed by the compiler, can be performed, at least partially, by one or more processors that are temporarily configured (e.g., by software) or permanently configured to perform the relevant operations. Whether temporarily or permanently configured, such processors can constitute processor-implemented modules that operate to perform one or more operations or functions. The modules referred to herein can, in some example embodiments, comprise processor-implemented modules.

Similarly, the methods described herein can be at least partially processor-implemented. For example, at least some of the operations of a method can be performed by one or processors or processor-implemented hardware modules. The performance of certain of the operations can be distributed among the one or more processors, not only residing within a single machine, but deployed across a number of machines. In some example embodiments, the processor or processors can be located in a single location (e.g., within a home environment, an office environment or as a server farm), while in other embodiments the processors can be distributed across a number of locations.

The one or more processors can also operate to support performance of the relevant operations in a "cloud computing" environment or as a "software as a service" (SaaS). For example, at least some of the operations can be performed by a group of computers (as examples of machines including processors), these operations being accessible via a network (e.g., the Internet) and via one or more appropriate interfaces (e.g., application program interfaces (APIs).)

The descriptions of the various embodiments of the present invention have been presented for purposes of illustration, but are not intended to be exhaustive or limited to the embodiments described. Many modifications and variations will be apparent to those of ordinary skills in the art without departing from the scope and spirit of the described embodiments. The terminology used herein was chosen to best explain the one or more embodiments, the practical application or technical improvement over technologies found in the marketplace, or to enable others of ordinary skills in the art to understand the embodiments described herein.

The present invention can be a system, a method, and/or a computer program product. The computer program product can include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can include copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention can be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions can be provided to at least one processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks or modules. These computer readable program instructions can also be stored in a computer readable storage medium that can direct a computer, a programmable data processing apparatus, and/or other devices to function in a particular manner, such that the computer readable storage medium having instructions stored therein includes an article of manufacture including instructions which implement aspects of the function/act specified in the flowchart and/or block diagram block or blocks or modules.

The computer readable program instructions can also be loaded onto a computer, other programmable data processing apparatus, or other device to cause a series of operational blocks/steps to be performed on the computer, other programmable apparatus or other device to produce a computer implemented process, such that the instructions which execute on the computer, other programmable apparatus, or other device implement the functions/acts specified in the flowchart and/or block diagram block or blocks or modules.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which includes one or more executable instructions for implementing the specified logical function(s). In some alternative implementations, the functions noted in the blocks can occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C)

only, or the selection of all three options (A and B and C). This may be extended, as readily apparent by one of ordinary skill in this and related arts, for as many items listed.

Having described preferred embodiments of a system and method for concurrently or simultaneously modeling post-litho CDs and post-etch CDs of physical design layout patterns by employing neural networks (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for concurrently modeling post-lithography critical dimensions (CDs) and post-etch critical dimensions (CDs), the method comprising:
    generating lithographic aerial images of selected physical design layout patterns, the lithographic aerial images employed as training data;
    constructing a first portion of a neural network to be shared by two output channels;
    constructing a second portion of the neural network to be customized for each of the two output channels;
    training the neural network with the training data; and
    outputting simulated critical dimension values for lithography and etch processes.

2. The method of claim 1, wherein the first output channel is a post-lithography CD channel and the second channel is a post-etch CD channel.

3. The method of claim 1, wherein the neural network is a multi-task neural network.

4. The method of claim 1, further comprising analyzing correlational relationships between the post-lithography CDs and the post-etch CDs.

5. The method of claim 1, further comprising applying the neural network to concurrent full-chip modeling of the post-lithography CDs and the post-etch CDs.

6. The method of claim 1, further comprising fine-tuning hyperparameters of the neural network based on the simulated critical dimension values for lithography and etch processes.

7. The method of claim 1, further comprising displaying a visual representation of the simulated critical dimension values on a user interface.

8. A method for constructing a deep neural network based model to concurrently simulate post-lithography critical dimensions (CDs) and post-etch critical dimensions (CDs), the method comprising:
    generating lithographic aerial images of physical design layout patterns;
    constructing a multi-task neural network including two output channels;
    training the multi-task neural network with the training data of the lithographic aerial images; and
    outputting simulated critical dimension values pertaining to lithography and etch processes.

9. The method of claim 8, wherein the first output channel is a post-lithography CD channel and the second channel is a post-etch CD channel.

10. The method of claim 8, further comprising analyzing correlational relationships between the post-lithography CDs and the post-etch CDs.

11. The method of claim 8, further comprising applying the multi-task neural network to concurrent full-chip modeling of the post-lithography CDs and the post-etch CDs.

12. The method of claim 8, further comprising fine-tuning hyperparameters of the multi-task neural network based on the simulated critical dimension values for lithography and etch processes.

13. The method of claim 8, wherein the post-lithography CDs and the post-etch CDs are concurrently modeled for full-chip level evaluation.

14. The method of claim 8, further comprising displaying a visual representation of the simulated critical dimension values on a user interface.

15. A system configured to train a machine learning based model, the system comprising:
    one or more computer subsystems; and
    one or more components executed by the one or more computer subsystems, wherein the one or more components include the machine learning based model configured for performing one or more simulations by:
        generating lithographic aerial images of selected physical design layout patterns, the lithographic aerial images employed as training data;
        constructing a first portion of a neural network to be shared by two output channels;
        constructing a second portion of the neural network to be customized for each of the two output channels;
        training the neural network with the training data; and
        outputting simulated critical dimension values for lithography and etch processes.

16. The system of claim 15, wherein the first output channel is a post-lithography CD channel and the second channel is a post-etch CD channel.

17. The system of claim 15, wherein the neural network is a multi-task neural network.

18. The system of claim 15, wherein correlational relationships between the post-lithography CDs and the post-etch CDs are analyzed.

19. The system of claim 15, wherein the neural network is applied to concurrent full-chip modeling of the post-lithography CDs and the post-etch CDs.

20. The system of claim 15, wherein hyperparameters of the neural network are fine-tuned based on the simulated critical dimension values for lithography and etch processes.

* * * * *